United States Patent
Shalvi et al.

(10) Patent No.: US 9,449,705 B2
(45) Date of Patent: *Sep. 20, 2016

(54) PROGRAMMING SCHEMES FOR MULTI-LEVEL ANALOG MEMORY CELLS

(71) Applicant: Apple Inc., Cupertino, CA (US)

(72) Inventors: Ofir Shalvi, Ra'anana (IL); Naftali Sommer, Rishon-LeZion (IL); Dotan Sokolov, Ra'anana (IL); Yoav Kasorla, Kfar Netar (IL)

(73) Assignee: Apple Inc., Cupertino, CA (US)

( * ) Notice: Subject to any disclaimer, the term of this patent is extended or adjusted under 35 U.S.C. 154(b) by 108 days.

This patent is subject to a terminal disclaimer.

(21) Appl. No.: 14/173,965

(22) Filed: Feb. 6, 2014

(65) Prior Publication Data
US 2014/0157090 A1 Jun. 5, 2014

Related U.S. Application Data

(60) Continuation of application No. 13/566,372, filed on Aug. 3, 2012, now Pat. No. 8,681,549, which is a division of application No. 12/186,867, filed on Aug. 6, 2008, now Pat. No. 8,259,497.

(60) Provisional application No. 60/985,236, filed on Nov. 4, 2007, provisional application No. 60/970,058, filed on Sep. 5, 2007, provisional application No. 60/954,317, filed on Aug. 7, 2007, provisional application No. 60/954,169, filed on Aug. 6, 2007.

(51) Int. Cl.
| | |
|---|---|
| G11C 29/00 | (2006.01) |
| G06F 11/10 | (2006.01) |
| G11C 11/56 | (2006.01) |
| G11C 16/34 | (2006.01) |

(52) U.S. Cl.
CPC ........... *G11C 16/34* (2013.01); *G06F 11/1008* (2013.01); *G11C 11/56* (2013.01); *G11C 11/5628* (2013.01); *G11C 29/00* (2013.01)

(58) Field of Classification Search
CPC ... G11C 16/34; G11C 11/56; G11C 11/5628; G11C 29/00; G06F 11/1008
See application file for complete search history.

(56) References Cited

U.S. PATENT DOCUMENTS

| | | | |
|---|---|---|---|
| 7,391,649 B2 | 6/2008 | Kang et al. | |
| 7,515,484 B2 | 4/2009 | Seong | |
| 7,596,021 B2 | 9/2009 | Choi et al. | |
| 8,259,497 B2 * | 9/2012 | Shalvi et al. | 365/185.09 |
| 8,681,549 B2 * | 3/2014 | Shalvi et al. | 365/185.09 |
| 2002/0126531 A1 | 9/2002 | Hosono et al. | |
| 2003/0002348 A1 | 1/2003 | Chen et al. | |
| 2005/0248992 A1 * | 11/2005 | Hwang et al. | 365/185.28 |
| 2006/0028875 A1 * | 2/2006 | Avraham et al. | 365/185.24 |

(Continued)

*Primary Examiner* — John H. Hur
(74) *Attorney, Agent, or Firm* — Meyertons, Hood, Kivlin, Kowert & Goetzel, P.C.

(57) ABSTRACT

A method for data storage includes storing first data bits in a set of multi-bit analog memory cells at a first time by programming the memory cells to assume respective first programming levels. Second data bits are stored in the set of memory cells at a second time that is later than the first time by programming the memory cells to assume respective second programming levels that depend on the first programming levels and on the second data bits. A storage strategy is selected responsively to a difference between the first and second times. The storage strategy is applied to at least one group of the data bits, selected from among the first data bits and the second data bits.

20 Claims, 4 Drawing Sheets

(56) References Cited

U.S. PATENT DOCUMENTS

| | | |
|---|---|---|
| 2007/0035995 A1 | 2/2007 | Crippa et al. |
| 2007/0297228 A1 | 12/2007 | Song et al. |
| 2008/0162789 A1 | 7/2008 | Choi et al. |
| 2008/0177934 A1 | 7/2008 | Yu et al. |
| 2008/0181015 A1 | 7/2008 | Lee |
| 2009/0132755 A1 | 5/2009 | Radke |
| 2009/0323412 A1 | 12/2009 | Mokhlesi et al. |
| 2009/0327608 A1 | 12/2009 | Eschmann et al. |

\* cited by examiner

PROGRAMMING SCHEMES FOR MULTI-LEVEL ANALOG MEMORY CELLS

CROSS-REFERENCE TO RELATED APPLICATIONS

This application is a continuation of U.S. patent application Ser. No. 13/566,372, filed Aug. 3, 2012, which is a divisional of U.S. patent application Ser. No. 12/186,867, filed Aug. 6, 2008, which claims the benefit of U.S. Provisional Patent Application 60/954,169, filed Aug. 6, 2007, U.S. Provisional Patent Application 60/954,317, filed Aug. 7, 2007, U.S. Provisional Patent Application 60/970,058, filed Sep. 5, 2007 and U.S. Provisional Patent Application 60/985,236, filed Nov. 4, 2007, whose disclosures are incorporated herein by reference.

FIELD OF THE INVENTION

The present invention relates generally to memory devices, and particularly to methods and systems for programming multi-level analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory-PCM) cells. FRAM, MRAM and PRAM cells are described, for example, by Kim and Koh in "Future Memory Technology including Emerging New Memories," Proceedings of the 24.sup.th International Conference on Microelectronics (MIEL), Nis, Serbia and Montenegro, May 16-19, 2004, volume 1, pages 377-384, which is incorporated herein by reference.

Analog memory cells are often programmed using an iterative programming process that is commonly known as Program and verify (P&V). In a typical P&V process, a sequence of programming pulses is applied to a group of memory cells. The level of the programming pulses increases incrementally from pulse to pulse. The analog values programmed in the cells are read ("verified") after each pulse, and the iterations continue until the desired levels are reached.

Some programming processes vary the parameters of the P&V process during programming. For example, U.S. Pat. No. 7,002,843, whose disclosure is incorporated herein by reference, describes a non-volatile memory device that is programmed by first performing a coarse programming process and subsequently performing a fine programming process. The coarse/fine programming methodology is enhanced by using an efficient verification scheme that allows some non-volatile memory cells to be verified for the coarse programming process while other non-volatile memory cells are verified for the fine programming process.

As another example, U.S. Pat. No. 7,054,193, whose disclosure is incorporated herein by reference, describes write operations that simultaneously program multiple memory cells on the same word line in a Multi Bit Per Cell (MBPC) Flash memory. The write operations employ word line voltage variation, programming pulse width variation and data-dependent bit line and/or source line biasing to achieve uniform programming accuracy across a range of target threshold voltages.

U.S. Pat. No. 7,349,263, whose disclosure is incorporated herein by reference, describes nonvolatile memory devices, which support P&V operations that improve the threshold voltage distribution within programmed memory cells. The improvement is achieved by reducing a magnitude of the programming voltage steps and increasing a duration of the verify operations once at least one of the plurality of memory cells undergoing programming has been verified as a "passed" memory cell.

SUMMARY OF THE INVENTION

An embodiment of the present invention provides a method for data storage, including:

storing first data bits in a set of multi-bit analog memory cells at a first time by programming the memory cells to assume respective first programming levels;

storing second data bits in the set of memory cells at a second time that is later than the first time by programming the memory cells to assume respective second programming levels that depend on the first programming levels and on the second data bits; and selecting a storage strategy responsively to a difference between the first and second times, wherein the storage strategy is applied to at least one group of the data bits, selected from among the first data bits and the second data bits.

In some embodiments, selecting the storage strategy is performed at the first time following storage of the first data bits. In an embodiment, selecting the storage strategy includes drawing an inference with respect to the time difference based on a status of the memory cells following the storage of the first data bits. Drawing the inference may include detecting that the set of the memory cells is partially-programmed following the storage of the first data bits. In another embodiment, selecting the storage strategy is performed at the second time.

In some embodiments, the method includes reading from the memory cells at least one set of the stored data bits, selected from among the first data bits and the second data bits, wherein the storage strategy is applied in reading the at least one set of data bits. In an embodiment, selecting the storage strategy includes determining read thresholds to be used in reading the at least one set of data bits. In another embodiment, selecting the storage strategy includes selecting a decoding process for reading the at least one set of data bits.

In yet another embodiment, selecting the storage strategy includes modifying a programming parameter used in storing the at least one group of the data bits. In still another embodiment, storing the first and second data bits includes applying to the memory cells a sequence of programming pulses that incrementally increase by a step size, and selecting the storage strategy includes modifying the step size. In a disclosed embodiment, storing the first and second data bits includes encoding the at least one group of the data bits with an Error Correction Code (ECC), and selecting the storage strategy includes modifying a redundancy level of the ECC.

In an embodiment, programming the memory cells to assume the first and second programming levels includes writing to the cells predefined storage values that correspond to the respective programming levels and are separated from one another by predefined separations, and selecting the storage strategy includes modifying a separation between at least two programming levels selected from among the first and second programming levels. In another embodiment, selecting the storage strategy includes measuring the difference between the first and second times and comparing the measured difference to a threshold.

In yet another embodiment, storing the second data bits includes retrieving the stored first data bits from the memory cells, caching the retrieved first data bits in a buffer and computing the second programming levels based on the cached first data bits and the second data bits, and selecting the storage strategy includes correcting errors in the cached first data bits and re-writing the first data bits, after correction of the errors, to the buffer prior to computing the second programming levels.

In some embodiments, storing the second data bits includes retrieving the stored first data bits from the memory cells, caching the retrieved first data bits in a buffer and computing the second programming levels based on the cached first data bits and the second data bits, and selecting the storage strategy includes:

correcting errors in the cached first data bits to produce error-corrected bits;

re-retrieving the first data bits from the memory cells after storage of the second data bits; and selecting the storage strategy responsively to a discrepancy between the error-corrected bits and the re-retrieved first data bits.

In a disclosed embodiment, selecting the storage strategy includes:

retrieving at least part of the stored first data bits from the memory cells using one or more read thresholds;

processing the retrieved first data bits so as to modify the read thresholds;

re-retrieving the first data bits from the memory cells using the modified read thresholds; and computing the second programming levels responsively to the second data bits and the re-retrieved first data bits.

In an embodiment, processing the retrieved first data bits includes detecting errors in the retrieved first data bits and modifying the read thresholds responsively to the detected errors.

There is additionally provided, in accordance with an embodiment of the present invention, a method for data storage, including:

storing first data bits in a memory device, which includes a first set of multi-bit analog memory cells and a second set of digital memory cells, by programming the analog memory cells to assume respective first programming levels;

caching the first data bits in the digital memory cells;

accepting second data bits for storage in the first set of analog memory cells;

processing the accepted second data bits and the cached first data bits so as to compute respective second programming levels for the analog memory cells; and storing the second data bits in the first set of analog memory cells by programming the analog memory cells to assume the respective second programming levels.

In some embodiments, caching the first data bits includes evaluating a criterion with respect to the first data bits, and caching the first data bits only responsively to meeting the criterion.

In an embodiment, when the first data bits are not cached in the digital memory cells, the method includes retrieving the first data bits from the analog memory cells, correcting errors in the retrieved first data bits to produce error-corrected bits, and computing the second programming levels responsively to the second data bits and the error-corrected bits. In a disclosed embodiment, correcting the errors includes detecting the errors by error detection circuitry in the memory device and correcting the errors by error correction circuitry external to the memory device responsively to detecting the errors.

In another embodiment, storing the first data bits includes applying to the analog memory cells a first sequence of programming pulses that incrementally increase by a first step size, and storing the second data bits includes applying to the analog memory cells a second sequence of the programming pulses that incrementally increase by a second step size, smaller than the first step size.

There is also provided, in accordance with an embodiment of the present invention, apparatus for data storage, including:

programming circuitry, which is coupled to store first data bits in a set of multi-bit analog memory cells at a first time by programming the memory cells to assume respective first programming levels, and to store second data bits in the set of memory cells at a second time that is later than the first time by programming the memory cells to assume respective second programming levels that depend on the first programming levels and on the second data bits; and a processor, which is configured to select a storage strategy responsively to a difference between the first and second times, wherein the storage strategy is applied to at least one group of the data bits, selected from among the first data bits and the second data bits.

There is further provided, in accordance with an embodiment of the present invention, a memory device, including:

a first set of multi-bit analog memory cells;

a second set of digital memory cells; and control circuitry, which is coupled to store first data bits in the first set of analog memory cells by programming the analog memory cells to assume respective first programming levels, to cache the first data bits in the digital memory cells, to accept second data bits for storage in the first set of analog memory cells, to process the accepted second data bits and the cached first data bits so as to compute respective second programming levels for the analog memory cells, and to store the second data bits in the first set of analog memory cells by programming the analog memory cells to assume the respective second programming levels.

In some embodiments, the memory device includes a device package, and the analog memory cells, the digital memory cells and the control circuitry are packaged in the device package.

There is additionally provided, in accordance with an embodiment of the present invention, apparatus for data storage, including:

a memory including a set of multi-bit analog memory cells;

programming circuitry, which is coupled to store first data bits in the set of multi-bit analog memory cells at a first time by programming the memory cells to assume respective first programming levels, and to store second data bits in the set of memory cells at a second time that is later than the first time by programming the memory cells to assume respective second programming levels that depend on the first programming levels and on the second data bits; and a processor, which is configured to select a storage strategy responsively to a difference between the first and second times, wherein the storage strategy is applied to at least one group of the data bits, selected from among the first data bits and the second data bits.

The present invention will be more fully understood from the following detailed description of the embodiments thereof, taken together with the drawings in which:

DETAILED DESCRIPTION OF EMBODIMENTS

Overview

Figure 1:
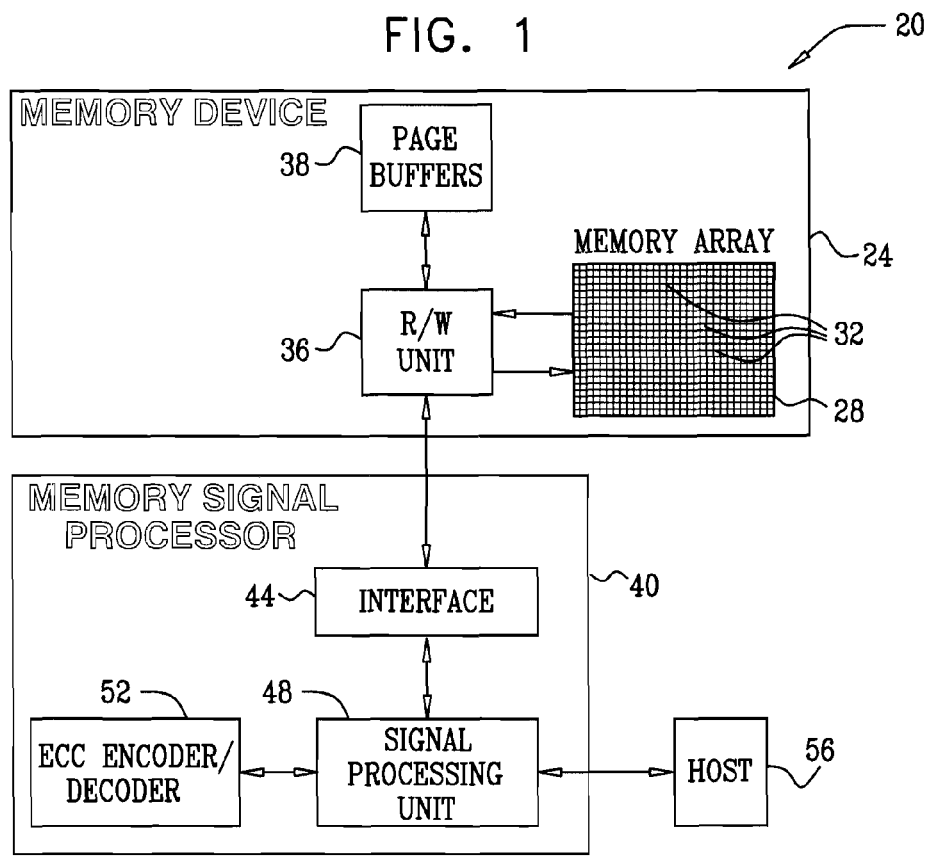
FIG. 1 is a block diagram that schematically illustrates a memory system, in accordance with an embodiment of the present invention.

In many multi-level analog device configurations, different memory pages are stored in different, respective bits of a group of memory cells. For example, a group of eight-level cells may store three memory pages, one page mapped to each bit of the cells. When programming a second or higher page, the storage value to be written to a given cell depends on the new bit to be written and on the previous programming state of the cell (i.e., on bits from previous pages that were written to the cell). Thus, in some conventional programming schemes, a second or higher page is programmed by (1) reading the storage values from the cells, (2) reconstructing the data of the previously-written page or pages, and (3) computing new programming levels for the cells based on the data of the new page and on the reconstructed data of the previous pages.

The process of reading and reconstructing the data of previously-written pages inherently introduces some error probability. When a reconstruction error occurs in a given cell, the new programming level computed for this cell when programming the new page is likely to be erroneous, as well. The probability of erroneous data reconstruction during programming operations is particularly severe when a large time gap exists between programming of the new page and programming of the previous pages (since distortion in analog memory cells typically increases over time). Such scenarios are referred to herein as Discontinuous Programming (DP) scenarios. Nevertheless, programming schemes that rely on reconstruction of previously-written data inevitably involve some error probability, regardless of the time gap between the programming of different pages. Such programming schemes are often designed to program the cells with high accuracy and/or to leave large margins between adjacent programming levels, in order to account for potential reconstruction errors. These measures typically reduce the programming speed and/or storage capacity of the cells.

Embodiments of the present invention provide improved methods and systems for storing data in arrays of multi-level analog memory cells, such as MLC Flash memory devices. The methods and systems described herein efficiently mitigate errors that may occur during programming due to reconstruction of previously-written pages.

In some embodiments that are described hereinbelow, a Memory Signal Processor (MSP) stores data in a memory, which comprises an array of multi-level (multi-bit) analog memory cells. The MSP identifies DP scenarios, i.e., scenarios in which large time gaps separate the programming of different pages to a given group of cells. When identifying a DP scenario, the MSP selects an appropriate storage strategy in order to compensate for the potentially-higher error probability associated with the DP scenario. The MSP may identify DP scenarios when programming early-arriving pages (i.e., before the potentially-large time gap), when programming late-arriving pages (i.e., after the potentially-large time gap), or even when reading the cells. Various methods for detecting DP scenarios, as well as various storage strategies that may be selected and applied in response to detecting such scenarios, are described below. By detecting and acting upon DP scenarios, the nominal accuracy of programming the cells can be relaxed, and programming speed can be increased accordingly.

In some embodiments, when programming an array of multi-bit analog memory cells, data of some of the programmed pages is cached in digital memory (e.g., in page buffers) for later use. When writing a second or higher page to a group of cells, the new programming levels are computed based on the cached data of previously-written pages, without having to read the cells and reconstruct the data. Computing the new programming levels based on cached data enables programming the cells with reduced precision, since there is no need to account for possible reconstruction errors. As a result, programming speed can be increased considerably.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and CTF Flash cells, PCM, NROM, FRAM, MRAM and DRAM cells. Memory cells 32 comprise Multi-Level Cells (MLC, also referred to as multi-bit cells), each storing multiple data bits.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 28, R/W unit 36 converts the storage values of memory cells 32 into digital samples having a resolution of one or more bits. Data is typically written to and read from the memory cells in groups that are referred to as pages. Memory device 24 comprises one or more page buffers 38, which are used for caching data pages during data storage and retrieval.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device.

In some embodiments, the data that is stored in device 24 is encoded with an Error Correction Code (ECC). For this purpose, MSP 40 comprises an ECC encoding/decoding unit 52. Unit 52 encodes the data prior to its storage in the memory cells, and decodes the encoded data retrieved from the memory.

MSP 40 communicates with a host 56, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. In some embodiments, each page comprises an entire row of the array. In alternative embodiments, each row (word line) can be divided into two or more pages (e.g., one page stored in the even-order cells of the word line and another page stored in the odd-order cells of the word line). Cells are typically erased in groups of word lines that are referred to as erasure blocks.

Data Storage in Multi-Bit Analog Memory Cells

In an N bits/cell memory, data is typically stored by programming each memory cell to one of $2^N$ predefined programming levels, with each level representing a possible combination of values of the N bits. For example, a four-level (2 bits/cell) memory may use four programming levels that represent {11}, {01}, {00} and {10} bit values, such as the levels shown in the following table:

TABLE-US-00001 Programming Bit values Nominal threshold level MSB LSB voltage (V) L0 1 1 −1 L1 0 1 1 L2 0 0 3 L3 1 0 5

One of the two bits of each cell is referred to as a Least Significant Bit (LSB) and the other bit is referred to as a Most Significant Bit (MSB). (Terms such as LSB and MSB are used merely as a way to refer to specific bits of the multi-bit memory cells, and do not imply that certain bits are more significant or important than others. Alternatively, any other suitable terminology can be used for referring to the individual bits stored in the cells.) Similar schemes can be defined for other types of multi-bit cells storing higher numbers of bits, such as eight-level cells storing 3 bits/cell or sixteen-level cells storing 4 bits/cell.

In some system configurations, the memory cells along a given word line (row) of the array store multiple memory pages. In a typical implementation, different bits are mapped to different pages. For example, in a given word line of a 2 bits/cell memory, a certain memory page may be stored in the LSBs of the cells and another page may be stored in the MSBs. In the description that follows, such pages are referred to as LSB pages and MSB pages for brevity. Similarly, in a 3 bits/cell device, the cells along a given word line may store three memory pages, referred to as an LSB page, a Central Significance Bit (CSB) page and an MSB page.

As can be appreciated, writing the MSB of a certain memory cell depends on the value of the LSB that was already written to the cell. Consider, for example, the table above. In order to program the MSB to "0", the cell is to be programmed to level L1 if the LSB is "1", and to level L2 if the LSB is "0". In many practical scenarios, however, the previously-written data may not be available when programming subsequent pages. For example, the MSB page of a given word line may be written weeks, months or even years after the LSB page of this word line was written.

Therefore, in many system configurations, programming a second (or higher) page is performed by:

Reading the storage values from the memory cells.

Reconstructing the current programming levels of the cells (i.e., reconstructing the data of the previously-written page or pages), such as by comparing the read storage values to one or more read thresholds. The reconstructed data is cached in page buffers 38.

Computing new programming levels for the cells based on the new data page to be written and on the reconstructed data cached in the page buffers.

Programming the memory cells to assume the new programming levels.

As noted above, writing a second (or higher) page to a group of multi-bit memory cells often comprises determining the current programming levels of the cells (i.e., reconstructing the data of previously-written pages). In many practical cases, however, the storage values read from the cells are distorted due to various distortion mechanisms, such as cross-coupling interference from neighboring cells, voltage drift due to aging, disturb noise from operations performed on other cells, and many others. Because of these distortion effects, reconstruction of the previously-written data has a certain error probability, i.e., a probability of erroneously determining the programming levels of the cells from the read storage values. When data reconstruction of the previously-written data of a given cell is erroneous, the programming of new data to the cell is likely to be erroneous, as well.

Discontinuous Programming of Multi-Bit Analog Memory Cells

The severity of distortion effects often depends on the time that passed since the cells were programmed. For example, storage values may drift over time due to charge loss. Neighboring memory cells may be programmed after the interfered cells and cause additional interference. Disturb noise may also accumulate over time due to operations applied to other cells in the array. Therefore, the probability of erroneous reconstruction of previously-written pages often increases with the time difference between the programming of these previous pages and the programming of the new page.

In view of this dependence, embodiments of the present invention provide improved methods and systems for storing data in multi-bit analog memory cells. As will be explained below, MSP 40 of system 20 identifies scenarios in which different bits of a given group of multi-bit cells are programmed (or expected to be programmed) at large time differences. These scenarios are referred to herein as Discontinuous Programming (DP) scenarios. When the MSP detects a DP scenario that is expected to cause potential errors, it selects an appropriate storage strategy in order to reduce or prevent these errors.

The term "storage strategy" refers to any action, process, parameter value or decision logic that applies to the programming and/or retrieval of data in the analog memory cells. Several exemplary storage strategies are described below.

In some embodiments, the MSP selects the strategy by modifying certain programming parameters that are used for programming the cells, so as to reduce the error probability caused by the large time gap between programming of the different bits. Various programming parameters can be modified by the MSP in order to improve performance in a given DP scenario. For example, when the cells are programmed using a Program and Verify (P&V) process, as is known in the art, the MSP may modify the programming step size (i.e., the difference between the magnitudes of successive programming pulses) used for programming the cells. Reducing the P&V programming step size improves programming accuracy (and therefore improves resilience to distortion) at the expense of higher programming time, and vice versa. Thus, if a DP scenario is detected, the MSP may program the current and/or new page with a reduced P&V step size in order to account for the potentially-higher error probability. Additionally or alternatively, other suitable P&V parameters can also be modified.

As another example, when the stored data is encoded with an Error Correcting Code (ECC), the MSP may increase the amount of redundancy (e.g., increase the ECC code rate) in response to detecting a DP scenario. As yet another example, the MSP may increase the voltage separation between adjacent programming levels to reduce the error probability. Further additionally or alternatively, any other suitable programming parameter can be modified.

Typically, programming parameters that reduce the error probability cause some kind of performance degradation (e.g., increase the programming time, reduce the storage capacity of the cells or extend the voltage window). This performance degradation is usually tolerable, since DP scenarios are relatively rare.

Figure 2:
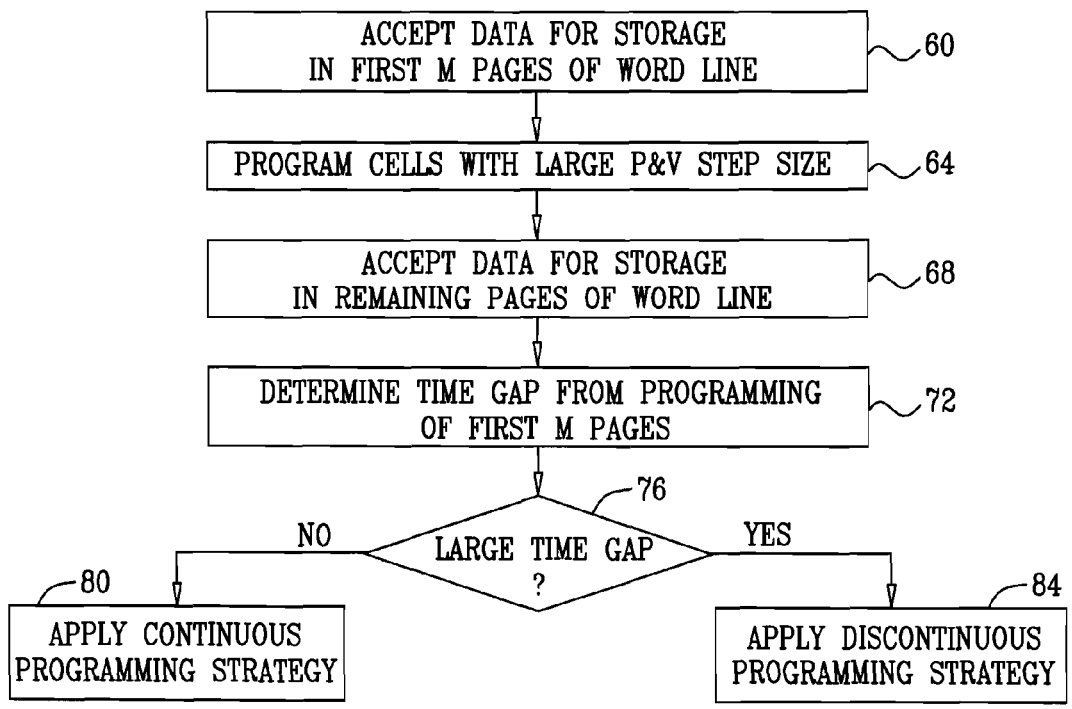
FIG. 2 is a flow chart that schematically illustrates a method for storing data in an array of multi-level memory cells, in accordance with an embodiment of the present invention.

FIG. 2 is a flow chart that schematically illustrates a method for storing data in array 28 of multi-level memory cells 32, in accordance with an embodiment of the present invention. The present example addresses a configuration in which cells 32 comprise N bits/cell MLC, with each bit corresponding to a different page. Thus, a group of memory cells along a certain word line stores up to N memory pages, which can be written together or separately at any given time.

The method begins with MSP 40 accepting data for storage in the first M pages mapped to the cell group (M<N), at a first input step 60. As explained above, the first M pages are to be written to the M least significant bits of the cells. The MSP, using R/W unit 36 of memory device 24, writes the first M pages to the memory cells, at a first programming step 64. The MSP instructs (or otherwise causes) the R/W unit to program the M least significant bits of the cells using a certain default P&V step size.

At a later time, the MSP accepts additional data for storage in one or more of the remaining N−M pages of the same group of memory cells, at a second input step 68. The MSP determines the time that elapsed since programming of the first M pages (M least significant bits of the cells), at a time gap measurement step 72. The MSP checks whether the time gap is sufficiently long to be regarded as a Discontinuous Programming (DP) scenario, at a gap checking step 76. For example, the MSP may compare the time gap to a predetermined threshold.

If the time gap is considered tolerable, i.e., sufficiently short, the MSP programs the remaining pages using certain default storage strategy (in the present example, using default programming parameters), at a continuous programming step 80. If, on the other hand, the time gap is regarded as a DP scenario (i.e., if an excessively long time passed since the first M pages were programmed), the MSP programs the later-arriving pages using a modified storage strategy (in this example, using modified programming parameters) designed to reduce the expected error probability, at a discontinuous programming step 84. For example, the MSP may control the R/W unit to apply a smaller P&V step size and/or apply higher ECC redundancy, in comparison with the default parameter values.

In the description above, the MSP detects a DP situation when programming the cells, and uses a modified strategy for programming the later-arriving (higher) pages. This scheme, however, was chosen purely by way of example. In general, the MSP may detect and act upon DP scenarios (or expected DP scenarios) when writing the earlier-arriving pages, when writing the later-arriving pages, and/or when retrieving the data from the memory cells.

In some embodiments, the MSP detects DP scenarios when programming (or intending to program) the M early-arriving pages written to the cells. For example, the MSP may accept a certain data item (e.g., a file) for storage, and determine that storing the data item will not fully program the group of cells in question. In other words, the MSP may conclude that after storing the data item in the first M bits of the cells, one or more pages (bits) of the group of cells will remain non-programmed. Since it is usually unknown when the remaining pages will be written, the MSP infers that the time gap is expected to be large, and therefore regards this situation as a potential DP scenario. In order to reduce the error probability that may be caused by the potential DP scenario, the MSP may program one or more of the M early-arriving pages using modified programming parameters (e.g., using a small P&V step size or high ECC redundancy).

Additionally or alternatively, the MSP may detect DP scenarios when programming (or intending to program) the later-arriving pages, a certain period of time after programming of the early-arriving pages. For example, the MSP may detect that a certain page is about to be programmed to a group of cells that were already partially-programmed a long time ago. In some embodiments, the MSP may maintain a list of the last X pages that were programmed during the past T seconds. Using this list, the MSP can determine whether a page that is about to be programmed is written to a group of cells that was partially-programmed more than T seconds ago. In some embodiments, if the MSP power supply is turned off temporarily, when power returns the MSP empties the list and regards all pages as potential DP scenarios. In some applications (e.g., in digital cameras), the power supply is typically turned on for only short periods of time. In such applications, the MSP typically applies a discontinuous programming strategy only if the cells have been partially programmed before power was turned on.

Upon detecting a possible DP scenario when programming a later-arriving page, the MSP may apply various storage strategies to reduce the high error probability that may be caused by this scenario.

For example, the MSP may improve the reliability of the data that was previously stored in the first M least significant bits of the cells. In some embodiments, the MSP improves the reliability of this data before computing the new programming levels by:

Reading the M initially-programmed pages (i.e., reading the storage values stored in the first M least significant bits of the cells), and caching the read data bits in page buffers 38 of the memory device.

Applying ECC decoding to the cached data.

Writing the data, after error correction, back into page buffers 38 of the memory device.

Using this process, the new programming levels will be computed based on error-corrected data, and the probability of error is therefore considerably reduced. In some system configurations, the MSP writes only the bits that were corrected by the ECC decoding process back into the page buffers, in order to reduce the data traffic between the MSP and the memory device, and thus reduce the programming time. This technique is particularly suitable for memory devices that support partial (selective) external programming of the page buffers.

In alternative embodiments, such as when the memory device does not support partial programming of the page buffers, the MSP may improve the reliability of the M previously-stored pages by applying the following strategy:

Reading the M initially-programmed pages, and caching the read data bits in page buffers 38.

Applying ECC decoding to the cached data, possibly in parallel to programming of the later-arriving pages.

Re-reading the first M pages from the cells after programming of the later-arriving pages is completed.

Comparing the re-read pages to the results of the ECC-corrected data.

Taking recovery measures if detecting large discrepancies between the ECC-corrected data and the re-read data. Recovery measures may comprise, for example, copying some or all of the M pages to another block, re-programming some or all of the M pages or increasing ECC redundancy in these pages.

In accordance with another possible strategy, the MSP may improve the reliability of the first M pages by further optimizing read parameters that will be used for reading these pages. For example, the MSP may adjust the read thresholds used for reading the storage values from the pages. Additionally or alternatively, the MSP may modify parameters such as the read bias voltage.

Additionally or alternatively, when the MSP detects a possible DP scenario when programming the later-arriving page or pages, it may reduce the potentially-high error probability by modifying the programming parameters used for programming the later-arriving page or pages. The MSP may modify any of the programming parameters described above, such as reducing the P&V programming step size, increasing the ECC redundancy or increasing the separation between programming levels.

In some embodiments, the MSP detects and acts upon DP scenarios when reading the cells. In other words, the storage strategy may apply to reading the cells. For example, the MSP may identify a possible DP scenario by detecting that the first page of a retrieved data item is not read from the LSBs of the cells, but from a higher-significance page. In such a situation, the low-significance pages stored in the cells are likely to belong to another data item, which may have been stored a long time before the presently-retrieved data item was stored.

In alternative embodiments, the MSP may store indications of possible DP scenarios when programming the cells, and act upon the stored indications when reading the cells. Any of the methods for identifying possible DP scenarios explained above can be used for this purpose. The DP indication of a given page may comprise a Boolean flag that indicates whether or not DP is suspected with respect to this page. The Boolean flags may be stored in one or more of cells 32. Alternatively, any other suitable technique can be used.

The MSP may select and apply various strategies in response to a suspected DP scenario when reading the cells. For example, the MSP may invoke a reading process having higher performance in comparison with the default reading process used for reading the cells. The higher-performance reading process may comprise, for example, computing soft metrics for decoding the ECC of these pages, estimating and canceling cross-coupling interference or other distortion in the pages, adjusting the read thresholds used for reading the pages, or any other suitable technique. Some of these processes involve re-reading the pages in question multiple times and combining the read results.

Techniques of this sort are described, for example, in PCT Application WO 2007/132453, entitled "Distortion Estimation and Cancellation in Memory Devices," filed May 10, 2007, PCT Application PCT/IL2007/001059, entitled "Estimation of Non-Linear Distortion in Memory Devices," filed Aug. 27, 2007, PCT Application WO 2007/132457, entitled "Combined Distortion Estimation and Error Correction Coding for Memory Devices," filed May 10, 2007, and U.S. patent application Ser. No. 11/995,814, entitled "Reading Memory Cells using Multiple Thresholds," filed Jan. 15, 2008, whose disclosures are incorporated herein by reference. An example method in which the MSP adjusts the read thresholds based on detected errors is described in FIG. 6 further below.

Programming MLC Bits Using Cached Previously-Programmed Bits

As explained above, the process of programming higher-significance bits of multi-bit memory cells by reading and reconstructing the data stored in lower-significance bits inevitably involves some error probability, which may cause programming errors. Although this effect may be more severe when programming is discontinuous (when long time intervals separate the programming of different bits), it exists to some degree regardless of the time that elapsed between programming of different bits.

Some embodiments of the present invention provide improved methods and systems for programming multi-bit memory cells. In accordance with these methods and systems, data pages that are written to a group of multi-bit analog memory cells are cached in digital memory for later use. When programming the higher-significance bits of the cell group, the new programming levels are computed based on the newly-arriving data that is intended for storage in the higher-significance bits and on the cached data of the lower-significance bits. Since these techniques do not read and reconstruct the lower-significance bits from the storage values stored in the analog memory cells, but rather use the digitally-cached data, they are not sensitive to read errors. These techniques usually increase programming speed, since reading the digitally-cached data is generally faster than reading the analog memory cells.

Figure 3:
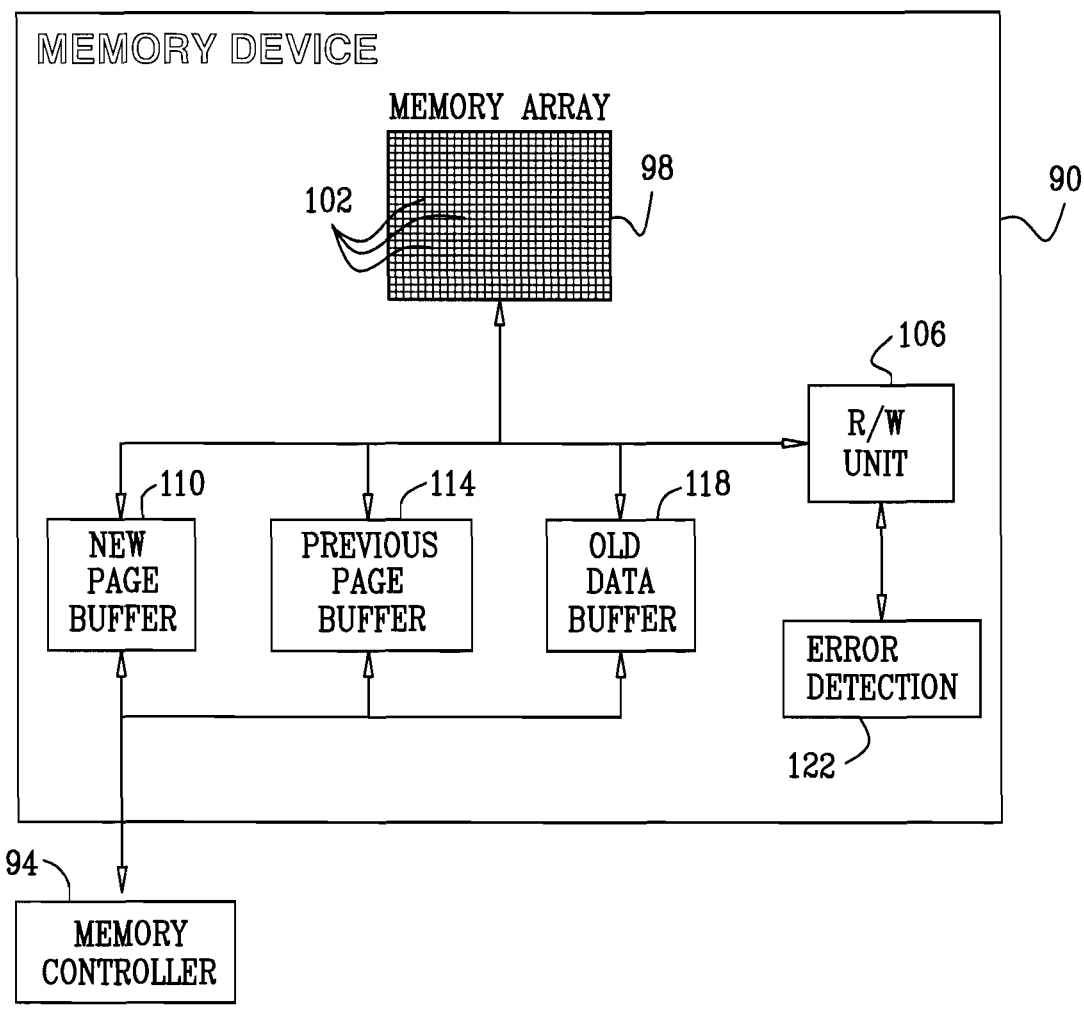
FIG. 3 is a block diagram that schematically illustrates a memory system, in accordance with an alternative embodiment of the present invention.

FIG. 3 is a block diagram that schematically illustrates a memory system, which comprises a memory device 90 that is controlled by a memory controller 94, in accordance with an alternative embodiment of the present invention. Memory device 90 comprises an array 98 of multi-bit (multi-level) analog memory cells 102, similar to array 28 of memory cells 32 in FIG. 1 above. Memory device 90 comprises a R/W unit 106, which is similar to R/W unit 36 of FIG. 1. Additionally, R/W unit 106 carries out various control functions that are described below. Thus, R/W unit 106 can be viewed as control circuitry of the memory device. The functionality of memory controller 94 may be carried out by any suitable processor, such as by an MSP or by a processor of the host system.

In some embodiments, MSP 40 in FIG. 1 and memory controller 94 in FIG. 3 comprise general-purpose processors, which are programmed in software to carry out the functions described herein. The software may be downloaded to the processors in electronic form, over a network, for example, or it may, alternatively or additionally, be provided and/or stored on tangible media, such as magnetic, optical, or electronic memory. Alternatively, some or all functions of MSP 40 and/or of controller 94 may be implemented in hardware of firmware.

Data that is written to array 98 is cached in three types of page buffers, namely a new page buffer 110, a previous page buffer 114 and an old data buffer 118. Each of buffers 110, 114 and 118 may store the data of one or more memory pages. Unlike analog memory cells 102, the page buffers (buffers 110, 114 and 118) comprise digital memory cells. In the context of the present patent application and in the claims, terms such as "digital memory" and "digital memory cell" refer to any type of memory that stores data by assuming a set of discrete states rather than a continuous range of analog values. Digital memory cells may comprise, for example, Static Random Access Memory (SRAM) cells, flip-flops or any other suitable type of digital cells. The digital memory cells typically comprise volatile memory.

New page buffer 110 holds the data of a memory page that is currently intended for writing to a given group of cells 102. The data stored in buffer 110 is typically provided by memory controller 94. Previous page buffer 114 holds the data of one or more pages that were previously written to the same group of cells into which the page stored in buffer 110 is to be written. Old data buffer 118 stores the data of various pages that were written in the past in array 98. R/W unit 106 may copy the data stored in the new page buffer to the previous page buffer and/or to the old data buffer.

Typically although not necessarily, array 98 of analog memory cells 102, digital page buffers 110, 114 and 118, and R/W unit 106 are packaged in a single device package.

In a typical flow, memory controller 94 requests memory device 90 (e.g., using the well-known NAND interface) to store a certain memory page in array 98. If the page is intended for storage in a group of memory cells whose lower-significant bits are already programmed, the R/W unit calculates the new programming levels of these cells based on (1) the data of the new page received from the memory controller and (2) the data of the pages that were previously-stored in the group of cells and cached in buffers 114 or 118. In some embodiments, the R/W unit computes the new programming levels based on the data cached in previous page buffer 114. If necessary, the R/W unit copies the appropriate page or pages from old data buffer 118 to buffer 114 before performing the computation.

As can be appreciated, caching all or even most of the pages in buffer 118 is usually not feasible. In a typical implementation, only a small fraction of the data of the pages stored in array 98 can be cached in buffer 118. In some embodiments, the memory controller selects which pages are to be cached in old data buffer 118 in accordance with certain predefined criteria. For example, the controller may cache pages whose distortion level is high, pages whose data is particularly sensitive, pages whose desired retention time is high, or pages that meet any other suitable criterion.

Pages that do not meet the predefined criteria are not cached in the old data buffer. When programming a given page, if the previous pages written to the same cell group are not available in buffer 118, they are read from array 98 in spite of the possibility of read errors. In some embodiments, some or all of the pages that are not cached in buffer 118 can be error-corrected by the memory controller, so as to reduce the likelihood of read errors. In such configurations, memory controller 94 is able to read and/or modify the data cached in previous page buffer 114. Using this functionality, the memory controller may process the data cached in buffer 114, such as apply error detection and/or correction to the cached data. If the memory controller modifies the data (e.g., corrects errors), it may store the modified data directly in buffer 114 without first caching it in buffer 110.

In some embodiments, device 90 further comprises an error detection unit 122, which is able to detect errors in the data that is cached in previous page buffer 114. For example, each page may be encoded with Cyclic Redundancy Check (CRC) bits, checksum bits or any other suitable type of Error Detection Code (EDC). Unit 122 decodes the EDC so as to identify the presence of errors in the data. In some embodiments, when the data is encoded with an ECC, unit 122 may comprise a reduced-complexity ECC decoder that is able to detect the presence of errors but not correct them. In such cases, the ECC is regarded as a type of error detection code.

In a possible flow, when writing a new page to a given group of cells, the R/W unit first checks whether the previous pages written to this cell group are available in buffer 118. If available, the R/W unit copies the previous pages to buffer 114 and computes the new programming levels based on the data of the new page cached in buffer 110 and on the data of the previous pages cached in buffer 114. If the data of the previous pages is not available in buffer 118, the R/W unit reads the previous pages from the analog cells, reconstructs the data of these pages and caches it in buffer 114. The memory controller retrieves the data cached in buffer 114, applies error correction and re-writes the error-corrected data to the buffer. Then, the R/W unit computes the new programming levels based on the new data in buffer 110 and on the error-corrected data of previous pages cached in buffer 114. This process considerably reduces the probability of error in computing the new programming levels.

The memory device configuration shown in FIG. 3 is an exemplary configuration, which is shown purely for the sake of conceptual clarity. In alternative embodiments, any other memory device configuration that allows (1) caching of previously-stored pages in digital memory and (2) use of cached pages in programming subsequent pages can also be used.

Since the process described above considerably reduces the probability of programming errors, the R/W may program the low-significance pages of the cells less accurately (e.g., using a large P&V step size) in comparison with conventional methods that read the previous pages from the cells. The use of large P&V step size increases the programming speed considerably.

For example, consider a group of 3 bits/cell memory cells, in which three data pages (LSB, CSB and MSB pages) can be stored. If the data of the LSB and CSB pages is cached in digital memory, then a larger error probability can be tolerated for these pages, since subsequent programming of the MSB page will be carried out using the cached data without reading the cells. Thus, the LSB and CSB pages can be programmed rapidly using a large P&V step size. In some embodiments, the LSB and MSB pages can be programmed so that the threshold voltage distributions of adjacent programming levels overlap one another. This is in contrast to conventional configurations, in which a certain voltage margin is maintained between adjacent programming levels.

Figure 4:
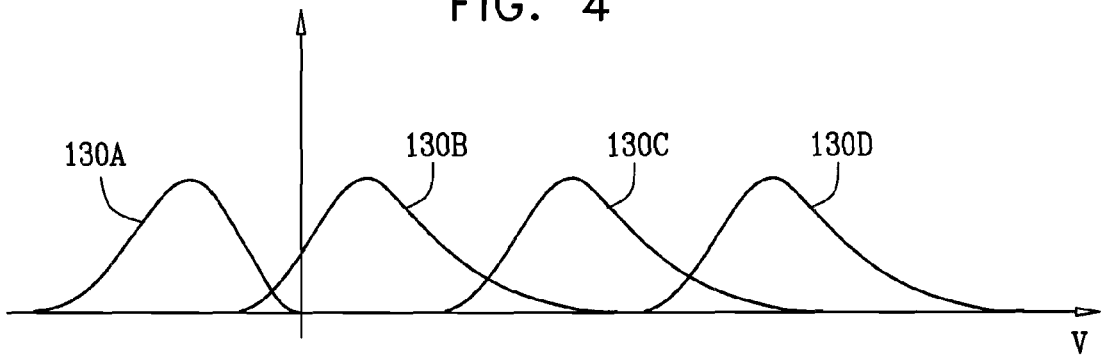
FIG. 4 is a graph showing threshold voltage distributions in a group of multi-level memory cells, in accordance with an embodiment of the present invention.

FIG. 4 is a graph showing threshold voltage distributions in a group of multi-level memory cells, in accordance with an embodiment of the present invention. FIG. 4 shows an exemplary scenario, in which the first two pages have been programmed into a group of 3 bits/cell memory cells with reduced accuracy (large P&V step size), as in the above example. The figure shows four threshold voltage distributions 130A . . . 130D, corresponding to four programming levels that store the LSB and CSB pages. As can be seen in the figure, the voltage distributions are relatively wide because of the large P&V step size, and adjacent programming levels overlap one another.

Figure 5:
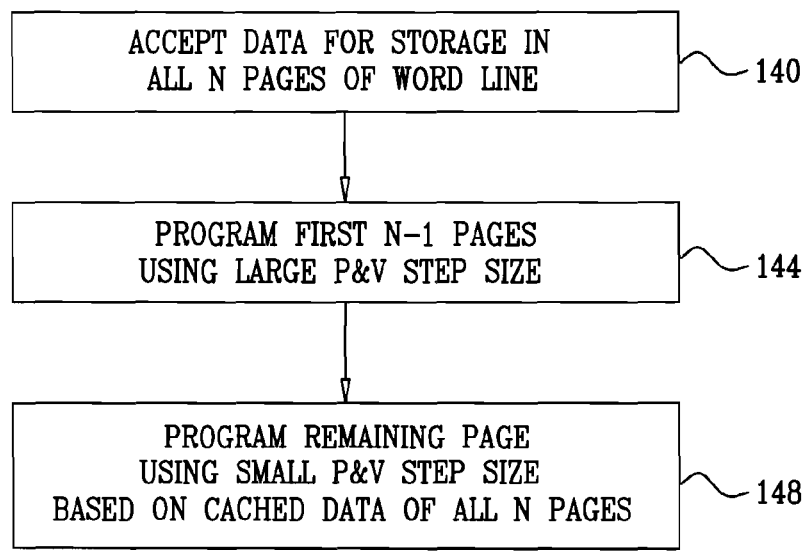
FIGS. 5 and 6 are flow charts that schematically illustrate methods for storing data in an array of multi-level memory cells, in accordance with embodiments of the present invention.

FIG. 5 is a flow chart that schematically illustrates a method for storing data in array 98 of N bits/cell analog memory cells 102, in accordance with another embodiment of the present invention. In this embodiment, the cells along each word line store N pages, and there is no distinction between odd-order and even-order bit lines. However, the method of FIG. 5 can be generalized to odd/even configurations in a straightforward manner.

The method begins with memory controller 94 accepting a data item (e.g., a file) for storage in array 98 at an input step 140. The memory controller concludes that the data item will occupy all N pages of a given word line. The memory controller typically determines the number of bits to be programmed to each cell based on the total number of pages to be stored, in accordance with the mapping of pages to word lines that is used in the particular memory device.

The memory controller may determine the total number of pages using various means. For example, in some embodiments the memory controller carries out the file system functionality that specifies the required size. In other embodiments, the memory controller may carry out a Logical Block Addressing (LBA) or Block Abstracted (BA) interface, as is known in the art, in which the host system issues a program command with a large number of sectors, ending up with a large number of pages. As another example, the host system may issue to the memory controller a dedicated command or signal indicating the start and size of the data item. As yet another example, the memory controller may support a dedicated programming command for programming multiple pages.

Upon determining that the data item will occupy all N pages, the memory controller (using R/w unit 106) programs the first N−1 pages rapidly using a large P&V step size, at a first programming step 144. The memory device caches the data of the first N−1 pages in buffer 114, as explained above. The memory controller (using R/W unit 106) then programs the N.sup.th page using a P&V step size that is smaller than the step size used for programming the first N−1 pages, at a second programming step 148. In order to program the N.sup.th page, unit 106 computes the new programming levels of the cells using the data of the N.sup.th page (cached in buffer 110) and of the data of the first N−1 pages (cached in buffer 114).

Typically, the memory controller acknowledges to the host system that the programming is completed only after all N pages have been programmed successfully. In some embodiments, the memory controller may use modified programming parameters (e.g., higher ECC redundancy, as described in FIG. 2 above) when programming the first N−1 pages, in order to compensate for the possibly-higher error probability that may be caused by the larger P&V step size.

The description above referred to a programming operation that programs all N pages of a given word line.

However, the method of FIG. 5 can be used in any scenario in which the memory controller identifies that a programming task would program M pages out of the N possible pages, M.ltoreq.N. Upon identifying such a scenario, the memory controller programs the first M−1 pages rapidly with a large P&V step size, and the M.sup.th page with a smaller step size, using the cached data of the previous pages.

Reliable Programming Using Read Threshold Adjustment

As explained above, in many data storage schemes, programming a second or higher page in a group of cells typically involves reading and reconstructing the data of the previously-written page or pages, and then computing new programming levels for the cells based on the data of the new page and on the reconstructed data of the previous pages. In these schemes, read errors in reading the previously-written page or pages may lead to errors in programming the new page.

In some embodiments, the MSP reduces the probability of read errors in reading the previously-written pages by adjusting the read thresholds that are used by the memory device to read these pages. In many cases, the MSP is in a better position than the memory device to carry out this adjustment, since it can apply various signal processing techniques (e.g., error detection and correction) for determining the optimal read threshold values.

Figure 6:
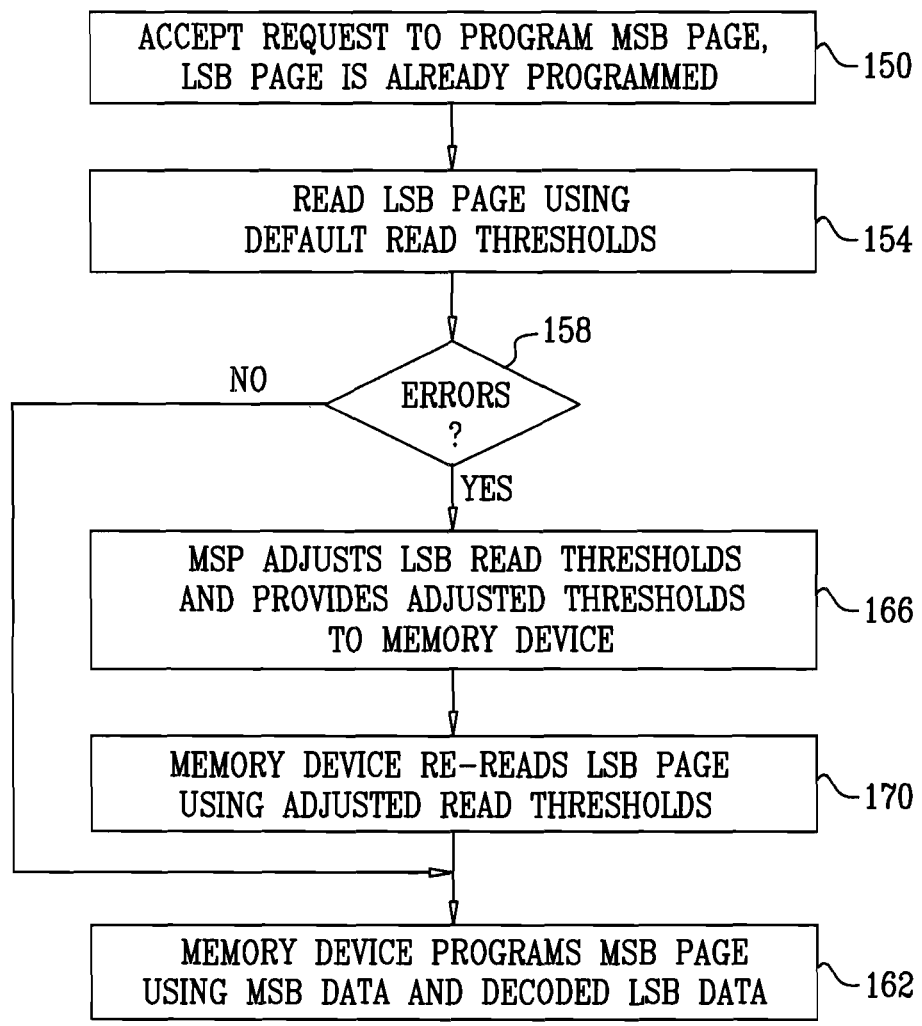

FIG. 6 is a flow chart that schematically illustrates a method for storing data in an array of analog memory cells, in accordance with another embodiment of the present invention. The present example refers to programming of an LSB page and an MSB page in a group of 2 bits/cell analog memory cells. The method can be used, however, with multi-level memory cells storing any desired number of bits.

The method begins with the MSP accepting a request to program the MSB page of a group of cells, at a programming request step 150. The data to be programmed in the MSB page is provided in or with the request. The LSB page of the group of cells in question is assumed to be already programmed. In response to the request, the MSP instructs the memory device to read the LSB page. The memory device reads the LSB page using a default set of read thresholds, at an LSB reading step 154. The memory device sends the data read from the LSB page to the MSP.

The MSP checks whether the read LSB data contains errors, at an error checking step 158. The MSP may apply any suitable error detection or correction technique for this purpose. If the MSP does not find errors in the read LSB data, it instructs the memory device to proceed and program the MBS page. The memory device programs the MSB page, at an MSB programming step 162. The memory device computes the programming levels for programming the cells based on (1) the MSB data provided at step 150 above, and (2) the LSB data read at step 154 above.

If, on the other hand, the MSP finds that the LSB data read at step 154 does contain errors, the MSP adjusts the read thresholds used for reading the LSB page, at a threshold adjustment step 166. The MSP may use any suitable technique for adjusting the LSB read thresholds based on the detected errors. For example, for each corrected error event, the MSP may determine the programming level that was initially programmed and the (different) programming level that was actually decoded. The MSP may compute the threshold adjustments based on the intended and actual programming levels. Generally, however, the MSP may adjust the read thresholds based on both corrected and uncorrected errors.

The MSP provides the adjusted LSB read thresholds to the memory device. The memory device re-reads the LSB page using the adjusted read thresholds, at an LSB re-reading step 170. The re-read operation is typically internal to the memory device, and the memory device does not report the re-read results to the MSP. Because of the optimized threshold values, the LSB data read at step 170 will typically have no errors, or at least fewer errors in comparison with the data read at step 154.

Having now obtained error-reduced LSB data, the memory device programs the MSB page using the re-read LSB data (re-read at step 170) and the MSB data (accepted at step 150), at MSB programming step 162. Since the re-read LSB data was read using the adjusted threshold and has little or no errors, the MSB programming has a reduced number of errors, as well.

In some embodiments, the memory device uses different sets of read thresholds for different scenarios of programmed and non-programmed pages. For example, the memory device may use a certain set of read thresholds when only the LSB page is programmed, and another set of thresholds when both LSB and MSB pages are programmed. Typically, the MSP is capable of setting the different sets of read thresholds used by the memory device. The MSP is typically able to set the read thresholds for both external read operations (in which the memory device reports the read data to the MSP) and internal read operations (in which the read data is used only internally to the memory device and are not reported to the MSP).

In some embodiments, the MSP may re-read the LSB page and re-adjust the read thresholds iteratively, e.g., until converging to satisfactory error performance.

The method of FIG. 6 can be generalized in a straightforward manner to memory cells storing any desired number of bits. At each stage, the MSP adjusts the read thresholds of the lowest M pages, and then programs the (M+1).sup.th page using the error-reduced data read from the previous M pages.

The additional re-read operations carried out in the method of FIG. 6 may reduce the programming speed of the system. However, when the different pages of the group of cells are programmed substantially at the same time (e.g., sequentially), the MSP can avoid the extra re-read operations, since the storage values of the cells are not likely to drift considerably between the programming of the pages. Therefore, on average, the number of extra re-read operations is relatively rare, and the programming speed of the system will not be degraded significantly. Thus, in some embodiments, the MSP reverts to the method of FIG. 6 upon detecting a Discontinuous Programming (DP) scenario.

In some embodiments, the MSP reads the previously-programmed pages from a group of cells before programming an additional page, in order to backup these pages against power failure or unexpected reset that may occur during the programming of the additional page. This sort of backup is especially important when the pages are not written sequentially to the cell group. These scenarios are also the typical scenarios in which the MSP re-reads the previously-programmed pages as part of the method of FIG. 6. Therefore, the extra re-read operations cause little or no degradation in programming speed.

The description of FIG. 6 above referred to adjusting the LSB read thresholds based on detected errors. In alternative embodiments, however, the MSP may apply various other signal processing methods to the LSB read results in order to adjust the read thresholds. Any suitable process can be used for this purpose. For example, PCT Application PCT/

IL2008/000329, entitled "Adaptive Estimation of Memory Cell Read Thresholds," filed Mar. 11, 2008, whose disclosure is incorporated herein by reference, describes several threshold adjustment methods in which the MSP estimates the Cumulative Distribution Function (CDF) of the storage values of the memory cells, and adjusts the read thresholds based on the estimated CDF.

In a typical flow, the memory device reads the LSB page using a certain set of read thresholds and sends the read results to the MSP. The MSP adjusts the read thresholds based on the read results, and updates the memory device with the adjusted threshold values. The memory device then re-reads the LSB page using the adjusted thresholds, and then computes the programming levels for programming the MSB page based on the re-read LSB data and the data to be programmed in the MSB page.

In some embodiments, the MSP can adjust the read thresholds using only part of the LSB read results. In these embodiments, the memory device may initially read only part of the LSB page (or transfer only part of the LSB read results to the MSP), thus reducing the degradation in programming speed.

Although the embodiments described herein mainly address data storage and retrieval in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method, comprising:
   receiving a first plurality of data bits to store in a memory device, wherein the memory device includes a first plurality of memory cells and a second plurality of memory cells;
   storing the first plurality of data bits in a respective subset of the first plurality of memory cells, wherein storing the first plurality of data bits includes programming the respective subset of the first plurality of memory cells dependent upon a respective set of first programming levels;
   evaluating a criterion of the received first plurality of data bits, wherein the criterion includes cross-coupling interference from one or more memory cells neighboring the first plurality of memory cells;
   storing the first plurality of data bits in the second plurality of memory cells in response to determining that the first plurality of data bits meet the evaluated criterion;
   receiving a second plurality of data bits to store in the memory device;
   determining a respective set of second programming levels dependent upon the received second plurality of data bits and an elapsed time since the storing in the first plurality of data bits; and
   storing the second plurality of data bits in the respective subset of the first plurality of memory cells, wherein storing the second plurality of data bits includes programming the respective subset of the first plurality of memory cells dependent upon the respective set of second programming levels.

2. The method of claim 1, wherein each memory cell of the first plurality of memory cells comprises a non-volatile memory cell.

3. The method of claim 1, wherein determining the respective set of second programming levels comprises retrieving the stored first plurality of data bits responsive to a determination that the first plurality of data bits are stored in the respective subset of the first plurality of memory cells.

4. The method of claim 3, wherein retrieving the stored first plurality of data bits comprises storing the retrieved first plurality of data bits in a buffer.

5. The method of claim 1, wherein the evaluated criterion further includes a distortion level of the first plurality of data bits.

6. The method of claim 3, wherein determining the respective set of second programming levels comprises detecting and correction errors in the retrieved first plurality of data bits.

7. The method of claim 1, wherein storing the first plurality of data bits comprises applying to the respective subset of the first plurality of memory cells a first sequence of programming pulses, wherein the first sequence of programming pulses are incrementally increased by a first step size, and wherein storing the second plurality of data bits comprises applying to the respective subset of the second plurality of memory cells a second sequence of programming pulses, wherein the second sequence of programming pulses are incrementally increased by a second step size, wherein the second step size is less than the first step size.

8. An apparatus, comprising:
   a first plurality of memory cells;
   a second plurality of memory cells; and
   a control circuit coupled to the first plurality of memory cells and the second plurality of memory cells, wherein the control circuit is configured to:
      receive a first plurality of data bits;
      store the first plurality of data bits in a respective subset of the first plurality of memory cells dependent upon a respective set of first programming levels;
      evaluate a criterion of the received first plurality of data bits;
      store the first plurality of data bits in a respective subset of the second plurality of memory cells in response to a determination that the first plurality of data bits meet the evaluated criterion;
      receive a second plurality of data bits;
      determine a respective set of second programming levels dependent upon the received second plurality of data bits; and
      store the second plurality of data bits in the respective subset of the first plurality of memory cells dependent upon the respective set of second programming levels.

9. The apparatus of claim 8, wherein each memory cell of the first plurality of memory cells comprises a non-volatile memory cell.

10. The apparatus of claim 8, wherein to determine the respective set of second programming levels the control circuit is further configured to retrieve the stored first plurality of data bits responsive to a determination that the first plurality of data bits are stored in the respective subset of the first plurality of memory cells.

11. The apparatus of claim 10, wherein to retrieve the stored first plurality of data bits the control circuit is further configured to store the retrieved first plurality of data bits in a buffer.

12. The apparatus of claim 8, wherein to determine the respective set of second programming levels the control circuit is further configured to detect and correct errors in the retrieved first plurality of data bits.

13. The apparatus of claim 8, wherein to store the first plurality of data bits the control circuit is further configured to apply to the respective subset of the first plurality of memory cells a first sequence of programming pulses, wherein the first sequence of programming pulses are incrementally increased by a first step size, and wherein to store the second plurality of data bits the control circuit is further configured to apply to the respective subset of the second plurality of memory cells a second sequence of programming pulses, wherein the second sequence of programming pulses are incrementally increased by a second step size, wherein the second step size is less than the first step size.

14. The apparatus of claim 8, wherein each cell of the second plurality of memory cells comprises a static random access memory cell.

15. A system, comprising:
 a memory device, wherein the memory device includes a first plurality of memory cells and a second plurality of memory cells; and
 a memory controller coupled to the memory device, wherein the memory controller is configured to:
  receive a first plurality of data bits;
  store the first plurality of data bits in a respective subset of the first plurality of memory cells dependent upon a respective set of first programming levels;
  evaluate a criterion of the received first plurality of data bits;
  store the first plurality of data bits in a respective subset of the second plurality of memory cells in response to a determination that the first plurality of data bits meets the evaluated criterion;
  receive a second plurality of data bits;
  determine a respective set of second programming levels dependent upon the received second plurality of data bits; and
  store the second plurality of data bits in the respective subset of the first plurality of memory cells dependent upon the respective set of second programming levels.

16. The system of claim 15, wherein each memory cell of the first plurality of memory cells comprises a non-volatile memory cell.

17. The system of claim 15, wherein to determine the respective set of second programming levels the memory controller is further configured to retrieve the stored first plurality of data bits responsive to a determination that the first plurality of data bits are stored in the respective subset of the first plurality of memory cells.

18. The system of claim 17, wherein to retrieve the stored first plurality of data bits the memory controller is further configured to store the retrieved first plurality of data bits in a buffer.

19. The system of claim 15, wherein to determine the respective set of second programming levels the memory controller is further configured to detect and correct errors in the retrieved first plurality of data bits.

20. The system of claim 15, wherein to store the first plurality of data bits the memory controller is further configured to apply to the respective subset of the first plurality of memory cells a first sequence of programming pulses, wherein the first sequence of programming pulses are incrementally increased by a first step size, and wherein to store the second plurality of data bits the memory controller is further configured to apply to the respective subset of the second plurality of memory cells a second sequence of programming pulses, wherein the second sequence of programming pulses are incrementally increased by a second step size, wherein the second step size is less than the first step size.

* * * * *